US006748335B2

(12) United States Patent
Pickerd

(10) Patent No.: US 6,748,335 B2
(45) Date of Patent: Jun. 8, 2004

(54) ACQUISITION SYSTEM FOR A MULTI-CHANNEL RELATIVELY LONG RECORD LENGTH DIGITAL STORAGE OSCILLOSCOPE

(75) Inventor: John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 114 days.

(21) Appl. No.: 10/140,790

(22) Filed: May 6, 2002

(65) Prior Publication Data

US 2003/0208328 A1 Nov. 6, 2003

(51) Int. Cl.[7] .......................... G06F 19/00; G01K 13/00
(52) U.S. Cl. ......................................... 702/66
(58) Field of Search ............................. 702/66–69, 127; 345/440.1

(56) References Cited

U.S. PATENT DOCUMENTS

| | | | |
|---|---|---|---|
| 4,975,636 A | * 12/1990 | Desautels | 324/121 R |
| 5,255,365 A | 10/1993 | Hungerbuhler | |
| 5,268,851 A | * 12/1993 | Zivny | 702/124 |
| 5,438,531 A | * 8/1995 | Shank | 708/13 |
| 5,898,420 A | * 4/1999 | Timm | 345/440.1 |
| 5,929,838 A | * 7/1999 | Hall | 345/440.1 |
| 5,978,742 A | * 11/1999 | Pickerd | 702/66 |
| 5,986,637 A | * 11/1999 | Etheridge et al. | 345/596 |
| 5,999,163 A | * 12/1999 | Ivers et al. | 345/208 |
| 6,151,010 A | 11/2000 | Miller et al. | |
| 6,195,617 B1 | 2/2001 | Miller | |
| 6,219,094 B1 | * 4/2001 | Gerlach et al. | 348/184 |
| 6,222,521 B1 | * 4/2001 | Ivers et al. | 345/440.1 |
| 6,271,773 B1 | * 8/2001 | Kobayashi | 341/51 |
| 6,615,369 B1 | * 9/2003 | Beck et al. | 714/39 |
| 2001/0001850 A1 | 5/2001 | Miller | |
| 2003/0220753 A1 | * 11/2003 | Pickerd et al. | 702/67 |

* cited by examiner

*Primary Examiner*—Kamini Shah
*Assistant Examiner*—Demetrius R. Pretlow
(74) *Attorney, Agent, or Firm*—Thomas F. Lenihan; Francis I. Gray

(57) ABSTRACT

A real time multi-channel digital storage oscilloscope acquires a relatively long data record for each channel in an acquisition memory and processes the data of the relatively long data record to search for predetermined events. Upon detection of such a predetermined event, circuitry generates an event detect signal, and data comprising an acquisition frame surrounding the event is applied to a waveform processing and display system. The relatively long data record can be replayed in order to perform additional searches throughout the data record using different search criteria, thereby permitting multiple waveforms to be displayed simultaneously, each being captured as a result of a different user-defined event. A screen display may be programmed to display a different kind of event such as Runt signal, Overshoot, or Pulsewidth Violation in each waveform, or to display multiple occurrences of the same kind of event such as Runt signal in each waveform. The multiple waveforms of the screen display may be derived from a single channel or from different channels.

31 Claims, 10 Drawing Sheets

ACQUISITION SYSTEM FOR A MULTI-CHANNEL RELATIVELY LONG RECORD LENGTH DIGITAL STORAGE OSCILLOSCOPE

FIELD OF THE INVENTION

The subject invention concerns, in general, the field of multi-channel Digital Storage Oscilloscopes (DSOs) having long record length capability, and concerns in particular, an architecture for DSOs that provides improved digital signal processing of long record length waveform data.

BACKGROUND OF THE INVENTION

The long-record-length features of modern long-record-length oscilloscopes are generally found to be very difficult and cumbersome to control. Even when the available memory is apportioned to active channels, the amount of data collected is difficult to use effectively (referred-to herein as a relatively long data record).

That is, when one has collected 8 Mbytes of data from four channels in such a deep memory oscilloscope, how does one then use and interpret that data? For example, assume a display of four rows of data (one for each active channel), and further assume that the user wanted to scroll through the entire record looking for a particular event that caused a problem in the system under test. For such a visual scan, a scrolling-rate of about 500 points per second is quite reasonable. That is, a particular point on each waveform would move across the screen from right to left in about 1.0 second. Unfortunately, at this rate it would take approximately 4.375 hours for the user to view the entire data record.

The fact that many oscilloscopes include a printer might lead one to think that the solution to this problem would be to merely print out the entire record. For such a print out, a resolution of 300 points per inch is quite reasonable. Unfortunately, if the user were to print out such a relatively long record on paper in four rows at 300 points per inch (approximately 118 points per cm), the printer would use 0.421 miles (0.6736 km) of paper. These two examples highlight the difficulty in dealing with large amounts of data. It simply is not practical for the user to visually inspect all of the collected data for the anomalies that the user must find.

Modern DSOs attempt to solve this problem by waiting for a trigger event to occur, and then acquiring in memory a frame of waveform data surrounding the event. The frame is then processed by waveform math software, measurement software, and display system software. All of this post-processing creates extremely long periods of "dead time", in which the DSO is incapable of acquiring and storing additional waveform samples. As a result, the anomaly that the user is searching for may occur, and be missed.

More recent DSOs have attempted to reduce the "dead time" by physically positioning Digital Signal Processing (DSP) ICs close to the acquisition memory to convert acquired waveform data to display data more efficiently. This arrangement is sometimes referred to as a "FastAcq" mode of operation. Use of FastAcq circuitry has greatly reduced the "dead time" between triggers, and increased the number of samples per second that are displayed. Unfortunately, the data frames processed by the FastAcq circuitry are not retained, and are therefore unavailable for additional processing. Moreover, cycle-to-cycle measurements (for jitter measurement) are adversely affected by the use of FastAcq circuitry because the time relationship between successive triggers is not maintained.

Another disadvantage of many current DSO architectures is a "bottleneck" that exists because they transfer all of the data from acquisition memory to main memory for processing and display over a relatively slow (i.e., typically 30 Mb/sec.) data bus.

In order to address this transfer-rate issue, Agilent Technologies, Inc. of Palo Alto, Calif., has recently introduced Infiniium MegaZoom deep-memory oscilloscopes employing a custom ASIC that optimizes the sample rate for a given sweep speed and sends only the waveform data needed for a particular front panel setting. MegaZoom provides a waveform update rate that is approximately twenty-five times greater than conventional deep memory oscilloscopes.

Wavemaster™ oscilloscopes with X-Stream™ technology, manufactured by LeCroy Corporation of Chestnut Ridge, N.Y. provide an alternative solution to the transfer-rate problem. These oscilloscopes employ a silicon-germanium (SiGe) digitizer and a high-speed streaming bus to transfer data from an analog to digital converter (ADC) through an acquisition memory and into a memory cache for extraction of information by software routines.

However, what is needed is an oscilloscope having the capability to repeatedly "loop through" the four-channel relatively-long data record in order to detect predetermined anomalies and produce a lively and active display.

SUMMARY OF THE INVENTION

A real time multi-channel digital storage oscilloscope acquires a relatively long data record for each channel in an acquisition memory and processes the data of the relatively long data record to search for predetermined events. Upon detection of such a predetermined event, circuitry generates an event detect signal, and data comprising an acquisition frame surrounding the event is applied to a waveform processing and display system. The relatively long data record can be replayed in order to perform additional searches throughout the data record using different search criteria, thereby permitting multiple waveforms to be displayed simultaneously, each being captured as a result of a different user-defined event. A screen display may be programmed to display a different kind of event such as Runt signal, Overshoot, or Pulsewidth Violation in each waveform, or to display multiple occurrences of the same kind of event such as Runt signal in each waveform. The multiple waveforms of the screen display may be derived from a single channel or from different channels.

DETAILED DESCRIPTION OF THE DRAWING

The term "long data record" as used herein means a data record acquired from a single channel and stored by concatenating all of the acquisition memory from all four data channels. The term "relatively long data record" as used herein means a data record acquired from at least two active channels and stored in memory allocated to the active channels.

Figure 1:
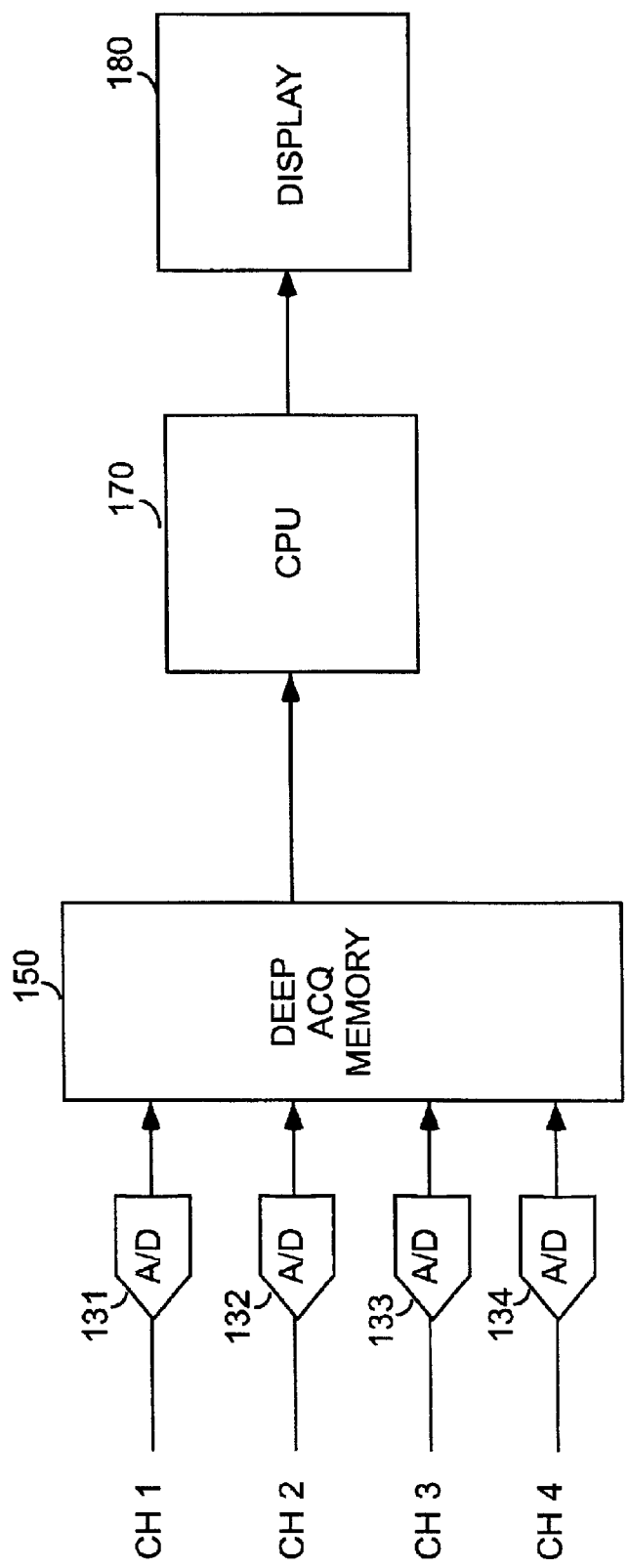
FIG. 1 is a simplified block diagram of the architecture for a conventional deep-memory digital storage oscilloscope, as known from the prior art.

FIG. 1 shows a highly simplified block diagram of a conventional four-channel deep-memory digital storage oscilloscope, as known from the prior art. Each channel has a respective analog-to-digital (A/D) converter 131, 132, 133, 134 for receiving an analog signal from a circuit under test via a probe and cable arrangement (not shown). A/D converters 131, 132, 133, 134, apply digital samples of their respective analog signal to a Deep-Acquisition Memory arrangement 150. The term "Deep-Acquisition Memory" means a memory capable of storing data records of millions of points to billions of points in length. A CPU 170 then processes all of the data of the data record for ultimate display on a display screen 180. There are two distinct problems associated with this type of architecture. First, CPU 170 forms a "bottleneck" in that it takes a significant amount of time to transfer such huge data records, resulting in dead time before another acquisition can be made. Second, CPU 170 may use an inordinate amount of computing resources to compress, for example, 32 Mpoints down to 500 points for display. Unfortunately, this expenditure of computing resources most often results in a viewable waveform that is of very little use to the operator.

Figure 2:
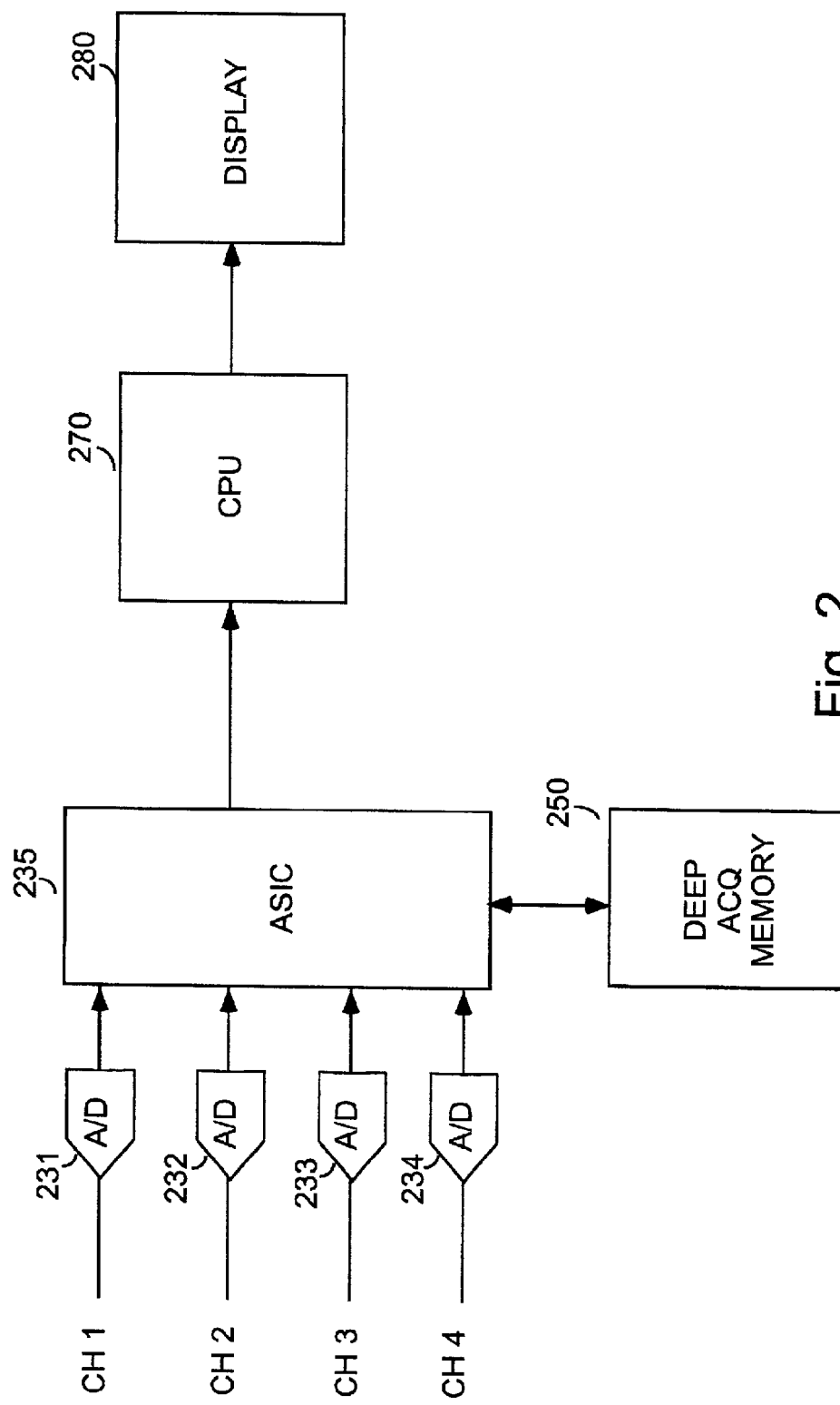
FIG. 2 is simplified block diagram of the architecture of a MegaZoom deep-memory digital storage oscilloscope, as known from the prior art.

In FIGS. 1 through 5, similarly numbered elements have similar functions which need not be described again. FIG. 2 shows a simplified block diagram of the aforementioned Agilent Technologies Infiniium oscilloscope with the MegaZoom feature. The MegaZoom feature employs a custom Application Specific Integrated Circuit (ASIC) 235 interposed between the A/D converters 231, 232, 233, 234 and The Deep Acquisition Memory unit 250. ASIC 235 communicates with a front panel (not shown) and optimizes the sample rate for a given sweep speed and sends to the CPU 270 only that waveform data needed for a particular front panel control setting. This operation significantly reduces the bottleneck described above, and provides for the display of a more meaningful signal.

Figure 3:
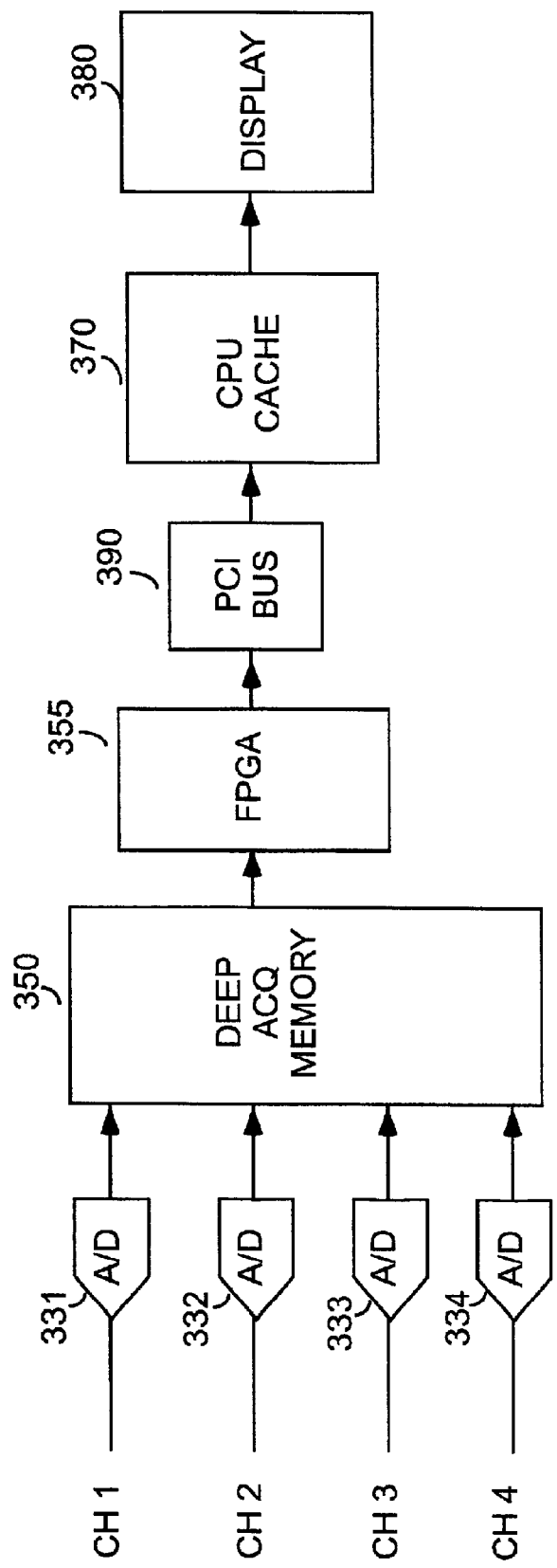
FIG. 3 shows a simplified block diagram of an acquisition architecture employing an FPGA for use in a digital storage oscilloscope, as known from the prior art.

FIG. 3 shows a highly simplified block diagram of an architecture that may be similar to that used in the above-mentioned LeCroy WaveMaster™ with X-Stream™ capability. This architecture is a significant improvement over that of FIG. 1 in terms of its ability to transfer data quickly from the acquisition system to the processing and display system. These oscilloscopes employ a silicon-germanium (SiGe) digitizer 355 which may be an FPGA and a high-speed streaming bus 390 to transfer data from an analog to digital converter (ADC) 331, 332, 333, 334 through a Deep Acquisition Memory 350 and into a Memory Cache 370 for extraction of information by software routines.

Figure 4:
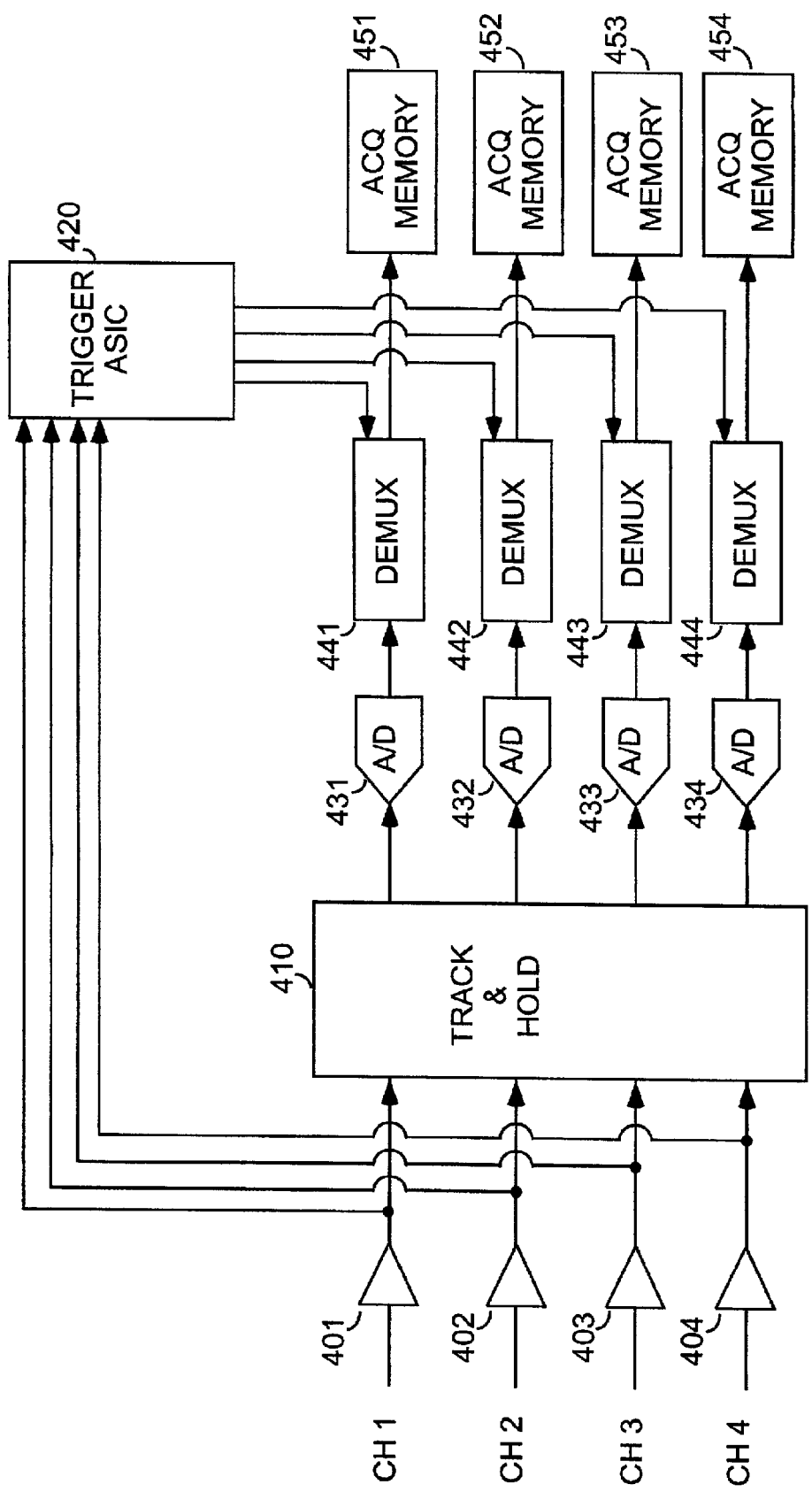
FIG. 4 shows a more detailed block diagram of the acquisition architecture of FIG. 1, as known from the prior art.

FIG. 4 is a more detailed view of the architecture of the acquisition system of a conventional deep memory oscilloscope. Referring to FIG. 4, Buffer amplifiers 401, 402, 403, 404, are associated with respective oscilloscope channels. Each of Buffer amplifiers 401, 402, 403, and 404 amplifies analog signal applied to its input and applies the buffered signal to a Track & Hold unit 410 and to a Trigger ASIC 420. Track & Hold unit 410 is basically an analog switch used to route signals to the A/D Converters according to different interleave configurations. Track & Hold unit 410 also stabilizes the input signal and presents it to an A/D Converter 431, 432, 433, 434.

A Demultiplexer unit (DEMUX) 441, 442, 443, 444 is itself an ASIC that receives the digitized samples of the input signal from the A/D Converters 431, 432, 433, 434 and also receives trigger signals from Trigger ASIC 420. As is well known, an A/D Converter produces data samples at a rate that is faster than a memory can store them. To solve this problem, a demux is used to reduce the rate at which memory-write operations occur by temporarily accumulating a series of high-speed data samples from the A/D and then storing in memory perhaps 16 to 32 of these samples in a single memory-write operation. In this way, the memory is allowed sufficient time to store its data before being presented with the next group of newly acquired data samples. In the absence of a trigger signal, the demux ASICs continuously write data into memory. When a trigger signal is received, the demux ASICs continue to write data into memory for only as long as necessary to store the required amount of post trigger data. At that time, data storage is stopped until a signal is received indicating that the acquisition memory has been unloaded into the processing system of the oscilloscope. Thus, DEMUX 441, 442, 443, 444 controls the flow of data into Deep Acquisition Memory 451, 452, 453, 454.

Unfortunately, none of the architectures illustrated in FIGS. 1 through 4 allows a user to repeatedly "loop through" the long data record, while triggering on different criteria, and observe the result in a lively and active display. An operator may realize that an anomaly is present in the signal under test and that the anomaly is causing a problem. However, he may not know what the anomaly is. How does one set up a trigger if one does not know if the anomaly is taking the form of runt, or pulse width problem, or even a missing pulse? Thus, it is important to be able to trigger on different criteria to detect the "unexpected" form of the variant, by changing the triggering criteria as one continuously loops through the long data record.

Figure 5:
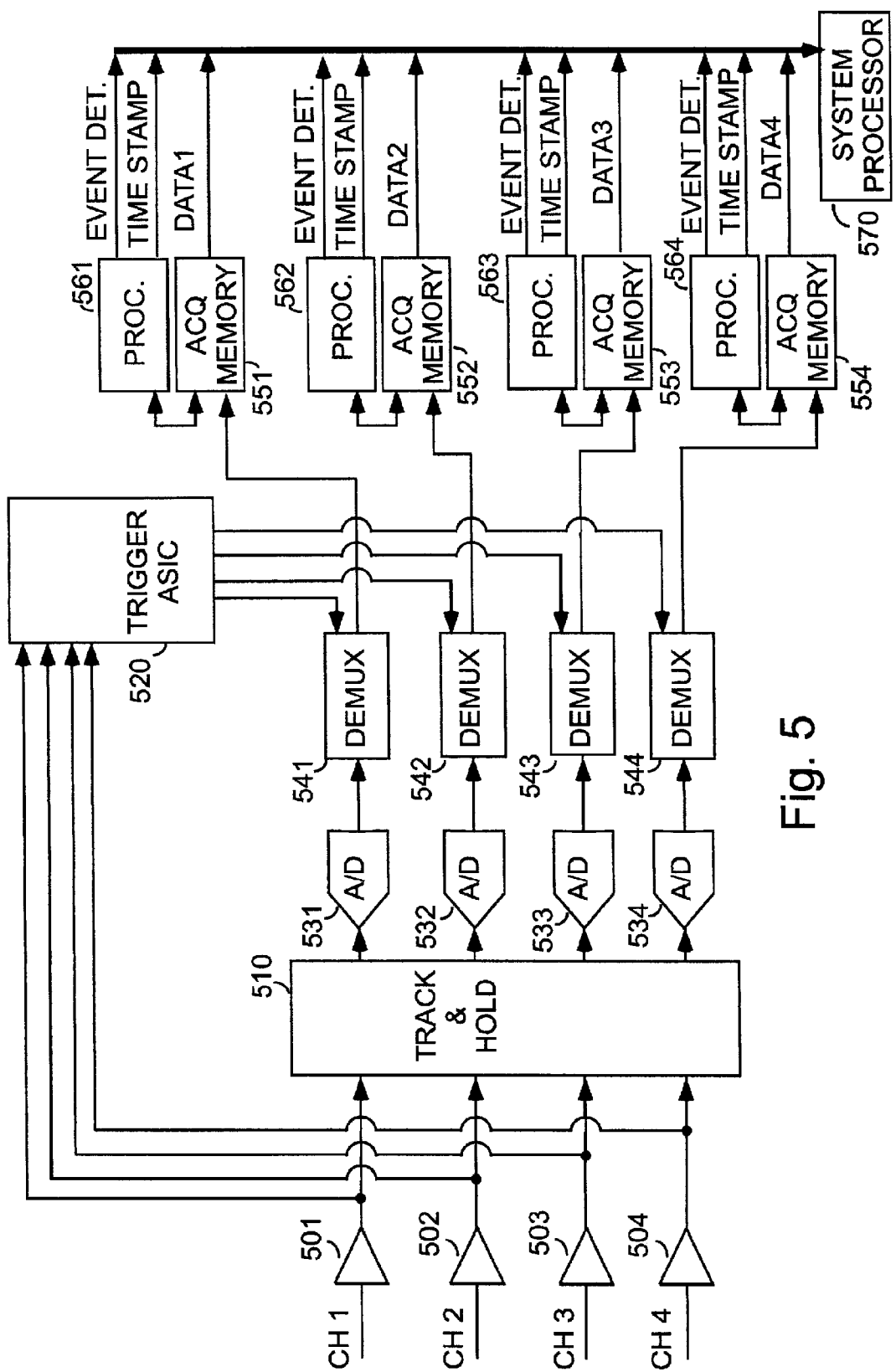
FIG. 5 shows a block diagram of an acquisition architecture employing a first arrangement of a processor and an acquisition memory for use in a digital storage oscilloscope in accordance with the subject invention.

Such an oscilloscope architecture is shown in FIG. 5, and the subject invention will now be described with respect to FIGS. 5, 6, 7, and 8. Since FIGS. 4 and 5 are identical with the exception of the close physical and logical association of a Processor unit (PROC.) 561, 562, 563, 564, with a Deep Acquisition Memory 551, 552, 553, 554, previously described elements need not be described again.

In the apparatus of FIG. 5, any or all of the channels (i.e., CH 1 through CH 4) are used to supply samples of the signal to be examined. In this regard, all of acquisition memories 551, 552, 553, and 554 may be concatenated to form a single long record length memory, or allocated to active channels. Processor unit (PROC.) 561, 562, 563, 564, may be a microcomputer, but preferably is an FPGA (Field Programmable Gate Array) because an FPGA is capable of processing data up to 100× faster than a microcomputer (i.e., up to 100× faster than an Intel Pentium IV™ microcomputer). Deep Acquisition Memory 551, 552, 553, 554 has a data path DATA1, DATA2, DATA3, DATA4, coupled to a bus leading to a System Processor 570, that is, to its normal waveform data processing path. Note that Processor unit 561, 562, 563, 564 also has a data output path labelled, TIME STAMP, also coupled to the bus for providing time stamps defining the frames of data to be processed and displayed. Processor unit 561, 562, 563, 564 also provides at least one trigger-type signal EVENT DET. (Event Detect). It is envisioned that EVENT DET. may in fact be multiple event detection signal lines coupled to System Processor 570. Each trigger output is latched so that it can later be read to determine which trigger event caused the post acquisition data frame to be processed. Processor unit 561, 562, 563, 564 may be a single processor controlling all acquisition memories, or a plurality of processors wherein each processor is associated with a portion of the acquisition memory (as shown in FIG. 5). With the illustrated arrangement of processing units in all channels, both parallel simultaneous triggering on predefined events is easily accomplished. Communication lines between the Processor unit 561, 562, 563, 564 are not shown for simplicity.

Figure 6:
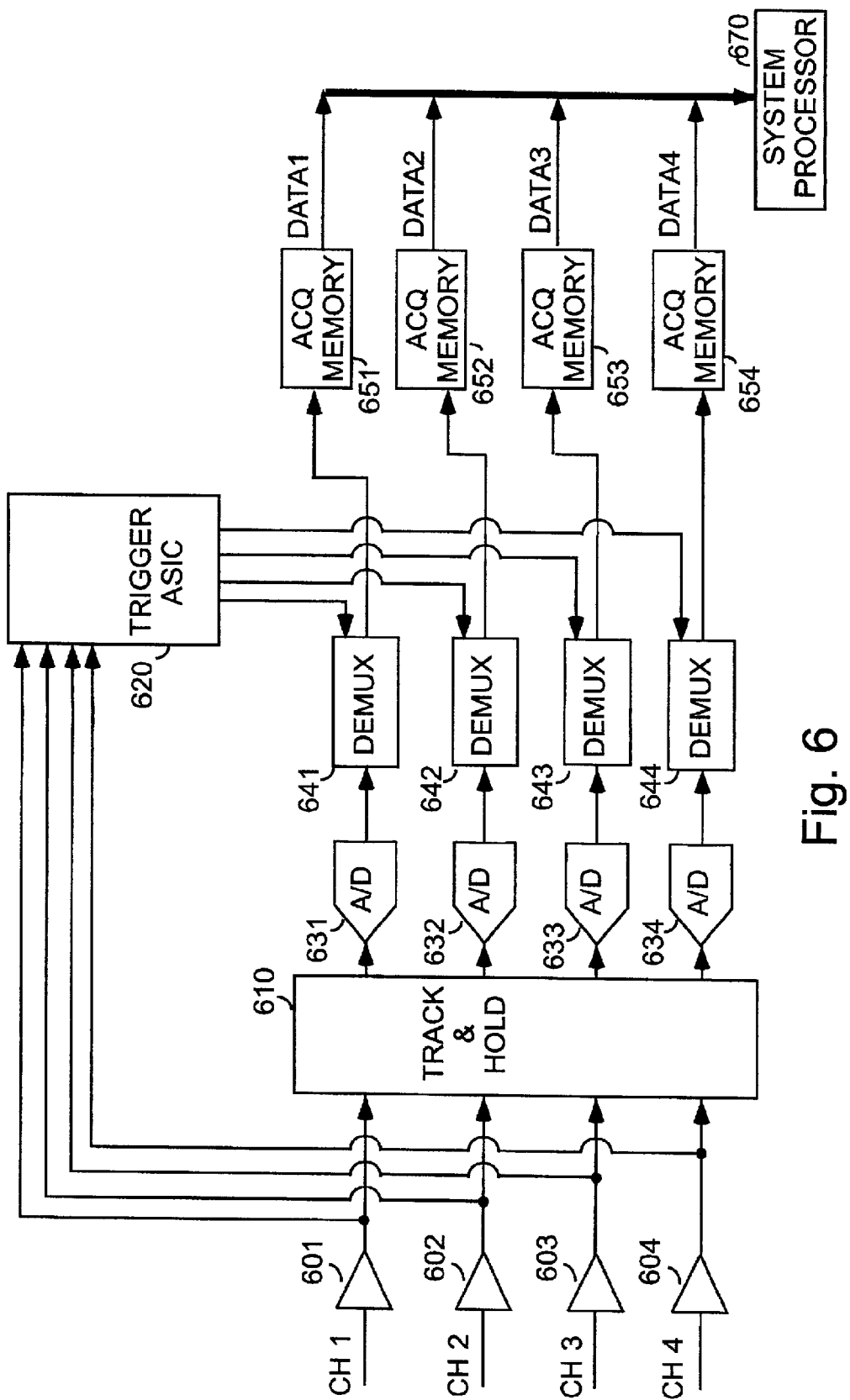
FIG. 6 shows a block diagram of an acquisition architecture employing a second arrangement of a System Processor and an acquisition memory for use in a digital storage oscilloscope in accordance with a second embodiment of the subject invention.

FIG. 6 shows an embodiment of the invention in which the system processor is programmed to also perform the function of post acquisition examination of the acquisition memory for the occurrence of specific predetermined events. In the embodiment of FIG. 6, no separate processor unit is employed. Since FIGS. 5 and 6 are identical with the exception of the close logical association of a System Processor 670 with a Deep Acquisition Memory 651, 652, 653, 654, previously described elements need not be described again.

System Processor 670 may be a microcomputer such as, an Intel Pentium IV® microcomputer. Deep Acquisition Memory 651, 652, 653, 654 has a data path DATA1, DATA2, DATA3, DATA4, coupled to a bus leading to System Processor 670, that is, to its normal waveform data processing path. Because System Processor 670 is performing the event search itself, there is no need for generating an EVENT DET. (Event Detect) signal, as was done in the embodiment of FIG. 5. With the illustrated arrangement of FIG. 6, System Processor 671 examines post-acquisition data acquired in all channels and permits simultaneous display of all detected predefined events on a display screen of the oscilloscope.

Figure 7:
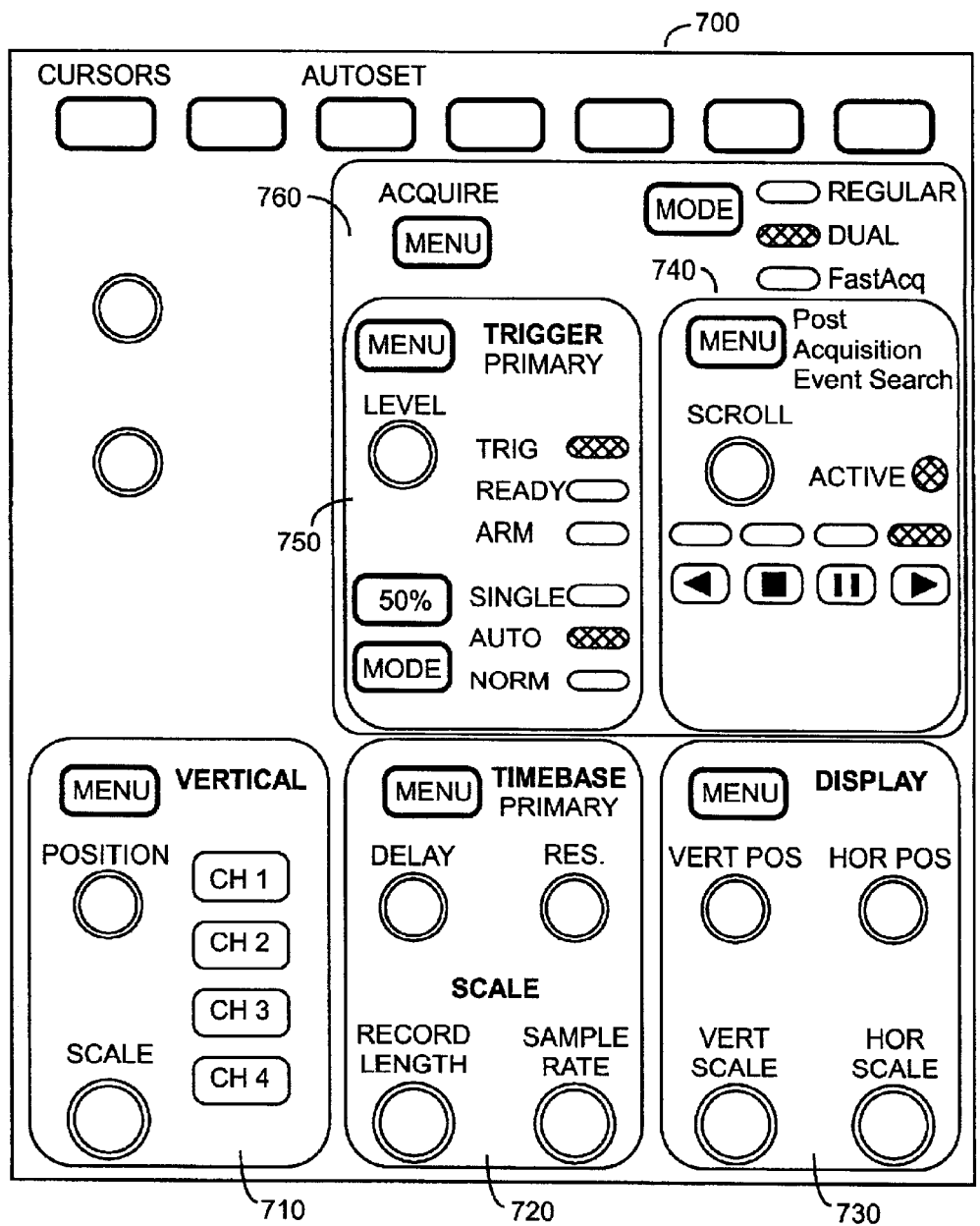
FIG. 7 shows a front panel arrangement of digital storage oscilloscope suitable for use with the invention.

FIG. 7 shows a front panel 700 for an oscilloscope having controls suitable for use with the subject invention. The oscilloscope controls are arranged in functional groups 710, 720, 730, 740, and 750. Functional groups 740 and 750 are arranged together in a further functional group 760. Front panel 700 includes standard control buttons such as CURSORS and AUTOSET and other control knobs that will not be described in detail. Functional group 710 includes controls for menu selection, for selecting a channel, and for adjusting the scale and position of the displayed signal waveform. Functional group 720 controls the timebase aspects of the signal to be acquired, such as Delay, Resolution, Record Length, and Sample Rate. Functional group 730 controls the Display and includes controls for Horizontal Position, Vertical Position, Vertical Scale and Horizontal Scale.

Functional group 760 includes Functional groups 740 and 750, and also a set of controls for controlling how the oscilloscope is to acquire the waveform samples of the signal under test. Specifically, a button is provided for displaying an Acquire menu on the display screen of the oscilloscope. A second button, labeled MODE, selects among REGULAR MODE, DUAL MODE, and FastAcq MODE. An indicator located next to each of these legends illuminates to show which mode is selected. The Illuminated indicator is depicted in FIG. 7 by a crosshatched pattern. When an operator wants to acquire a long length data record for Post Acquisition Search for Secondary Trigger Events, he selects DUAL MODE. In this mode the primary data acquisition record length is set to maximum, and the Post Acquisition Record length (Frame size) is set by the Record Length control of Functional group 720. Functional Group 740 controls the Post Acquisition Event Search and includes a MENU button for displaying a menu including a list of trigger event criteria. Note that "replay" of the long length data record is controlled by pushbutton controls that are similar in form and function to the controls of a VCR. In functional group 740, indicators are illuminated to show that a Post Acquisition Event Search is active, and that the long record length data is being played in a forward direction. Functional group 740 also includes a SCROLL knob for manually scrolling through a paused long record length waveform from one event to the next. Functional group 750 contains standard triggering controls and indicators.

Figure 8:
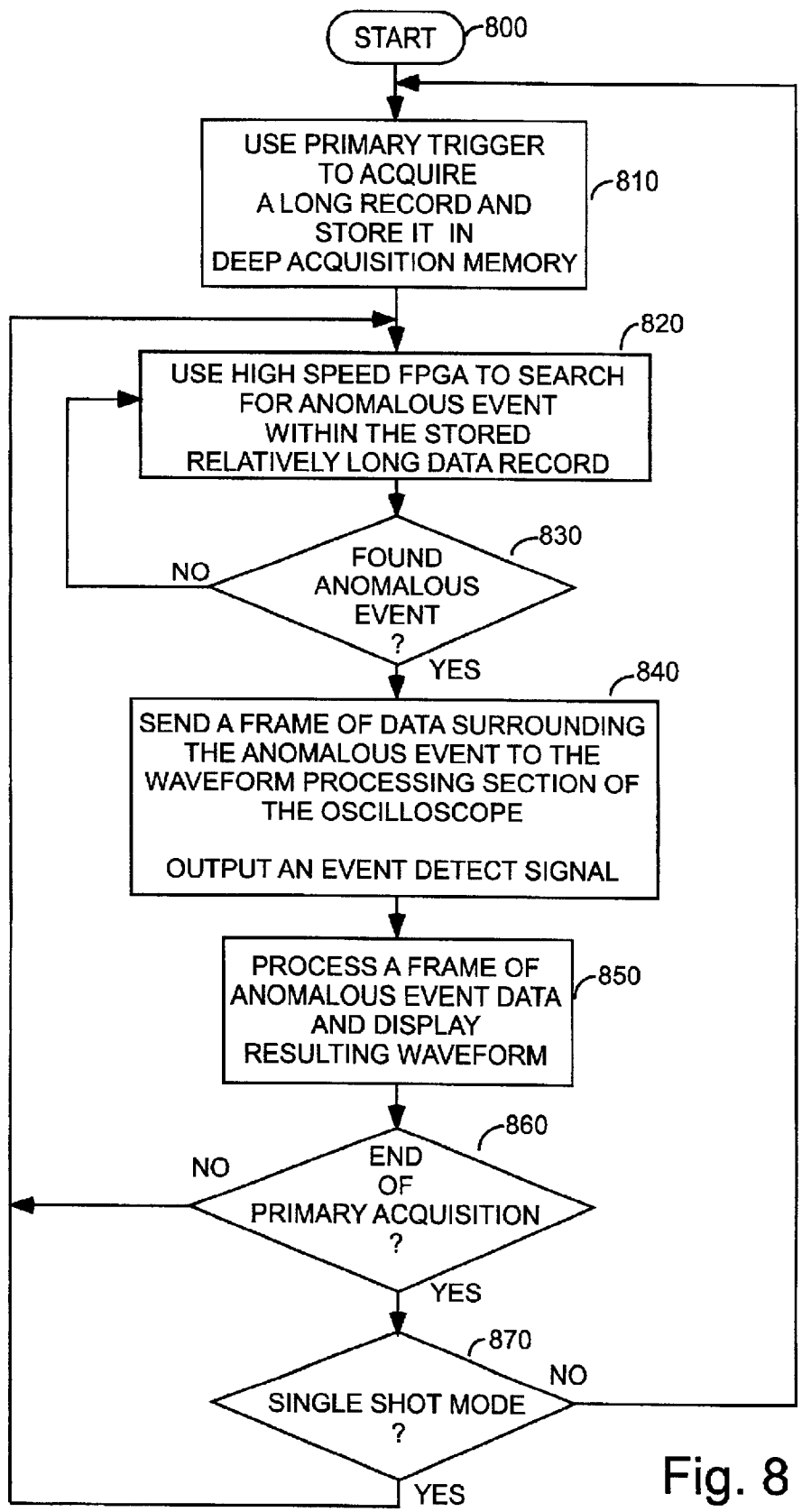
FIG. 8 is a simplified flowchart showing a Primary Acquisition and Post Acquisition Trigger Event Search routine, in accordance with the subject invention.

FIG. 8 is a simplified flowchart showing a Primary Acquisition and Post Acquisition Trigger Event Search routine for a multi-channel oscilloscope. The routine is entered at location 800 and advances to block 810 wherein the oscilloscope acquires a long record primary acquisition using standard criteria for primary triggering. After acquiring the long record, the routine advances to step 820 wherein Processor unit 561, 562, 563, 564 (preferably a high speed FPGA) of FIG. 5 (or System Processor 670) searches the stored relatively long record data of each active channel in a Post Acquisition Event Search for an anomalous event. At step 830, a check is made to see if the event of interest was found. If not, the routine continues looking for it within the acquired relatively long record data. If so, then the routine advances to step 840 wherein a frame of data surrounding the event is sent to the waveform processing section of the oscilloscope, and an EVENT DETECT signal is generated. At step 850, the frame of Post Processing anomalous event data is processed and the resulting waveform is displayed. A determination is made at step 860 of whether or not the end of the long record data has been reached. If not, the routine loops back to step 820 and continues looking for events within the relatively long record data. If so, the routine advances to step 870 to see if the oscilloscope is in One-Shot acquisition mode, or in Free-Run mode. If in One-Shot acquisition mode, no new data should be acquired, so the YES path is followed to step 820 and the search begins again within the previously acquired long record data. It in Free-Run mode (sometimes called Autorun mode), a new long record length acquisition will be performed, so the routine loops back to step 810 to acquire the new record before looking through it for Post Acquisition Events (anomalies).

There is a purpose for looping back to step 820 to continue searching through the previously acquired long record data when the Post Acquisition Search Event was not found. By doing so, the routine creates a lively responsive display because the user can change the search criteria and immediately see a change on the display. For instance, the operator may have set the Post Acquisition Search Event to be a Runt signal event (i.e., a detection of a pulse whose amplitude did not reach a switching threshold before returning to its original state). During the search the operator may change his mind and wish to search for a pulse having an out-of-tolerance pulse width. Immediately upon adjusting the search criteria, the displayed waveform will reflect the result of the new choice of event. That is, event types may be changed on-the-fly as the relatively long record length acquisition is being scanned.

Figure 9:
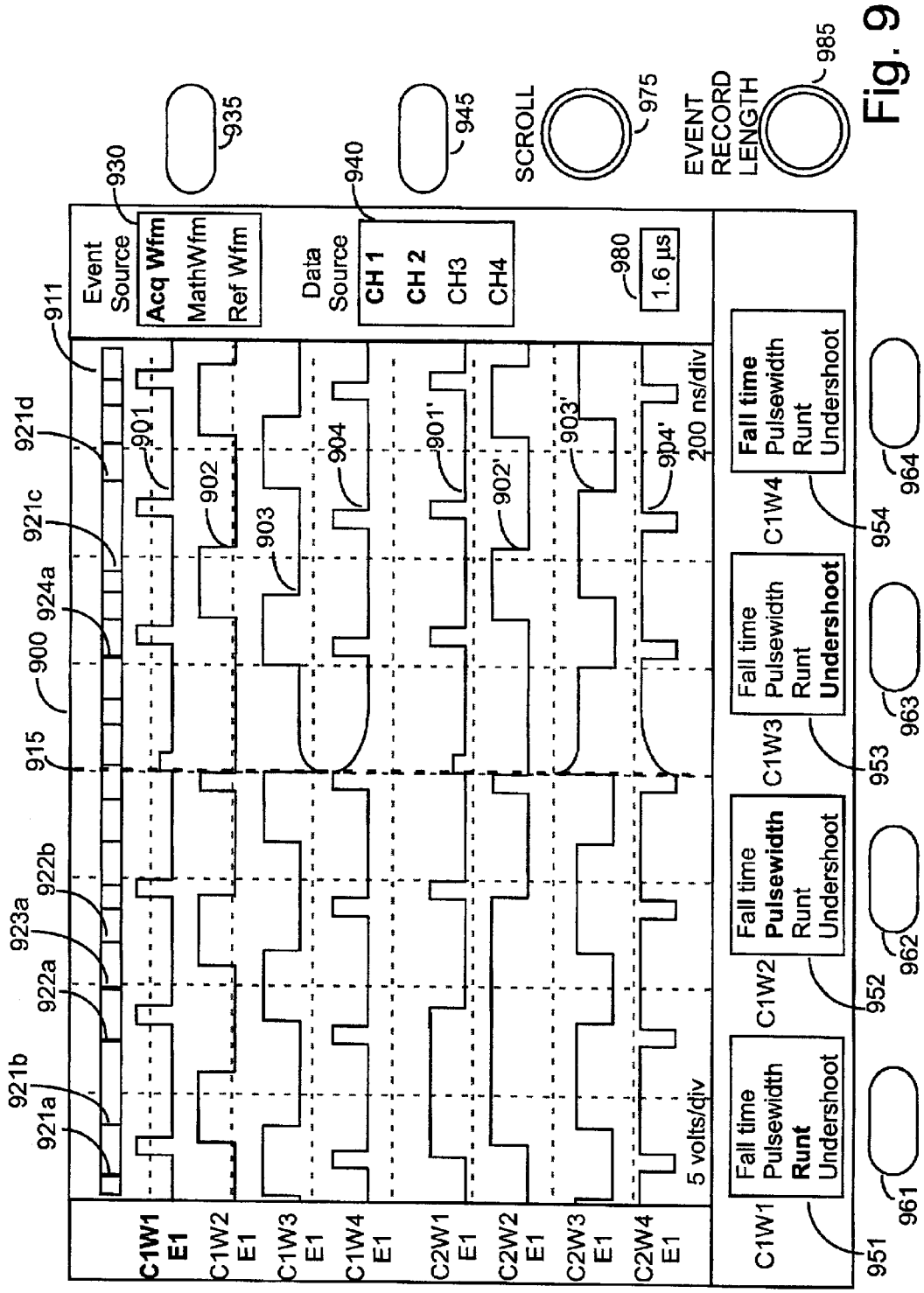
FIG. 9 is an illustration of a screen display in accordance with a first aspect of the subject invention.

FIG. 9 is an illustration of a screen display produced in accordance with the subject invention. A display screen 900 of a digital storage oscilloscope is shown displaying eight waveforms 901, 902, 903, 904, 901', 902', 903', 904'. Waveforms 901, 902, 903, and 904 are displays of waveforms received via channel 1, and waveforms 901', 902', 903' and 904' are displays of waveforms received via channel 2. Although four waveforms are shown for each channel, one skilled in the art will recognize that any number of waveforms may be used. Similarly, although only channels 1 and 2 are shown to be active, it is intended that any or all of the channels may be active and display waveforms simultaneously on-screen. Moreover, a screen display may include selected waveforms from each active channel.

Each waveform of FIG. 9 is exhibiting an anomaly that was detected and time-stamped by apparatus according to the subject invention. A Record Bar 911 provides an indication of the relative length of the record, and the positions of pointers 921a, 921b, 921c, 921d, 922a, 922b, 923a, 924a, within Record Bar 911 are representative of the approximate locations of the anomalies (i.e., Events) within the relatively long data record.

As noted above, the relatively long data record is acquired by using the criteria set in accordance with the normal trigger menu. Referring again to FIG. 9, an EVENT SOURCE menu 930 allows selection of the source waveform that will be searched for anomalies. The menu choices are selected in sequence by repeated pressing of a pushbutton 935. In this case, the Acq Wfm choice is highlighted to indicate that an acquired waveform has been selected to be the source waveform. Other choices are either of a Math Waveform (Math Wfm), or a reference waveform (Ref Wfm). Because Acq Wfm was selected, the next choice is that of the data channel, in this case, Chan 1 and Chan 2 have been highlighted to indicate their selection. After the relatively long data record is acquired, the data is searched for anomalies in a post-processing operation involving detection of the various anomalies and time-stamping their respective locations in memory.

Each of the four waveforms C1W1, C1W2, C1W3, C1W4 is controlled to display an anomaly (i.e., Event) chosen from a respective event menu 951, 952, 953, 954, by repeatedly pressing an associated pushbutton 961, 962, 963, 964. In this case, C1W1 displays examples of Runt signals, C1W2 displays examples of Pulsewidth violations, C1W3 displays examples of Undershoot conditions, and C1W4 displays examples of Fall time violations. Processor 561, 562, 563, 564, or System Processor 670, extracted short record length waveforms 901, 902, 903, 904 from the long record length data stored in acquisition memory, in response to a search for preselected anomalies (i.e., Post acquisition Search Events).

Similarly, each of the four waveforms C2W1, C2W2, C2W3, C2W4 is controlled to display an anomaly (i.e., Event) chosen from its respective event menu 951, 952, 953, 954, by selecting a Channel 2 waveform (e.g., by use of a touch screen) and then repeatedly pressing the associated pushbutton 961, 962, 963, 964. In this case, for simplicity of explanation, the anomalies chosen for the C2 waveforms are the same as those chosen for the C1 waveforms. That is, C2W1 displays examples of Runt signals, C2W2 displays examples of Pulsewidth violations, C2W3 displays examples of Undershoot conditions, and C2W4 displays examples of Fall time violations; When a channel 2 waveform is selected, the Record Pointers change automatically to indicate the positions of the anomalies within the channel 2 relatively long data record. It is intended that the memory depth of each record of all active channels is identical.

Processor 561, 562, 563, 564, or System Processor 670, extracted short record length waveforms 901, 902, 903, 904 from the relatively long data record stored in channel 1 acquisition memory, and extracted short record length waveforms 901', 902', 903', 904' from the relatively long data record stored in channel 2 acquisition memory in response to a search for preselected anomalies (i.e., Post acquisition Search Events).

The legend displayed to the left of the waveform 901 indicates the source C1 (channel 1), the selected kind of anomaly W1, and the occurrence number of that kind of event in the long data record E1. That is waveform 901 is displaying the first occurrence 921a of a runt trigger in the long data record. Similarly, waveforms 902, 903, 904 are displaying the first occurrence of their respective kind of anomaly 922a, 923a, 924a in the long data record, where pointer 921b indicates the second occurrence of a Runt signal in the long data record, and so on.

Selecting a waveform (for example, by physically touching the waveform on a touch-sensitive screen) logically connects the SCROLL knob 975 to that waveform. Thereafter, rotating the SCROLL knob 975 causes the waveform to jump to a display of the next example of that kind of event, wherever it occurs in the long data record. For example, rotating SCROLL knob 975 will cause the runt signal associated with pointer 921b to be displayed and to be labelled C1W1E2 (the second event of that kind). Selecting the second event will also cause pointer 921b to be highlighted, and pointer 921a to no longer be highlighted. SCROLL knob 975 is the same control labelled SCROLL in functional group 740 of FIG. 7.

Each of the waveforms is displayed with its anomaly centered on-screen (as shown by dotted vertical line 915) for ease of use. As noted above each event is surrounded by data, the number of samples of which is determined by rotation of an EVENT RECORD LENGTH knob 985. Numeric display 980 indicates that 1.6 $\mu$s of time surrounds the event of interest, and each of waveforms 901, 902, 903, 904 includes the same number of samples surrounding the event of interest. Note that there is no time relationship between the displayed waveforms.

Because waveform 901 is associated with a particular kind of anomaly whose locations are indicated by pointers 921a, 921b, 921c, 921d, it is envisioned that the waveform and the pointers be displayed in the same unique color (e.g., red). Similarly, waveform 902 is associated with pointers 922a, 922b and both should be displayed in a second unique color (e.g., yellow). Waveform 903 is associated with pointer 923a and both should be displayed in a third unique color (e.g., green). Waveform 904 is associated with pointer 924a and both should be displayed in a fourth unique color (e.g., blue). As noted above, the particular pointer associated with the anomaly currently displayed on-screen will be highlighted to indicate its position in the long data record (see 921a, 922a, 923a, 924a). Other colors should be used in waveform and pointer combinations from additional channels to avoid confusion.

Figure 10:
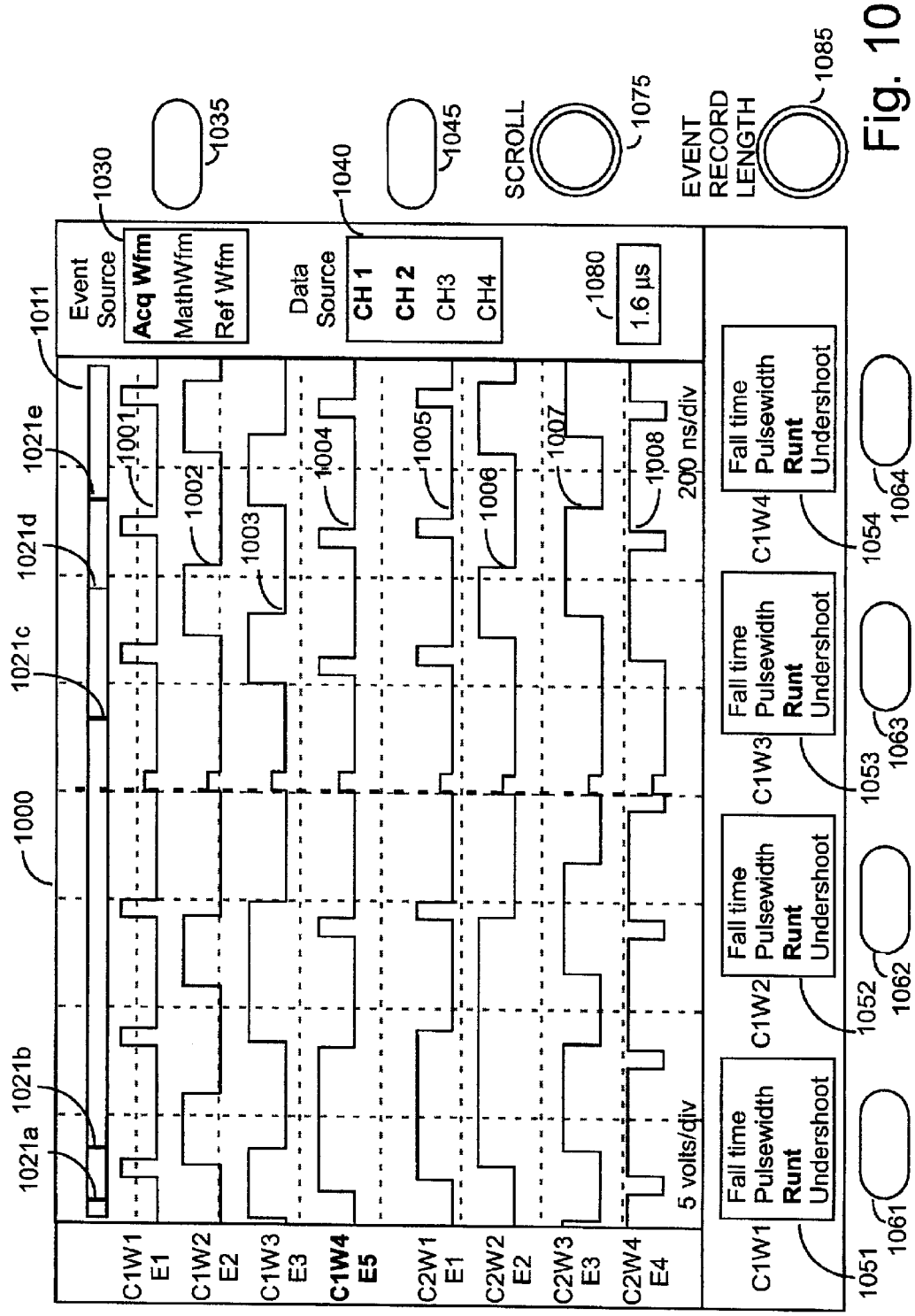
FIG. 10 is an illustration of a screen display in accordance with a second aspect of the subject invention.

While the operation of apparatus of the invention with respect to FIG. 9 is quite useful, one may wish to view all occurrences of single anomaly within all of the relatively long data records. The screen display of FIG. 10 provides an easy way to accomplish this goal. The majority of the elements of FIG. 10 are identical to similarly numbered elements of FIG. 9, and need not be described again. Event selection menus 1051, 1052, 1053, 1054 are used to program all of waveforms C1W1, C1W2, C1W3, C1W4, C2W1, C2W2, C2W3, C2W4 to display the same kind of event, a Runt signal. All pointers in Record Bar 1011 have been removed except for those 1021a, 1021b, 1021c, 1021d, 1021e that indicate the relative positions of runt signals in channel 1's relatively long data record, because a channel 1 signal (C1W1E1) is highlighted as being selected. Note that waveform W2 is labelled C1W2E2 to indicate that it is displaying the second runt trigger found, waveform W3 is labelled C1W3E3 to indicate that it is displaying the third runt trigger found, but waveform W4 is labelled C1W4E5 to indicate that it has been adjusted with SCROLL KNOB 1075 to display the fifth runt trigger found. In this regard, note that pointers 1021a, 1021b, 1021c, and 1021e are highlighted, but 1021d is not highlighted. The waveforms of channel 2 are similarly numbered to indicate which event is being displayed.

Some examples of Post Acquisition Search Events (anomalies) are:

| Jitter (width, rise, edge, etc.) | |
|---|---|
| Edge | High |
| Pulse width | Low |
| Pulse amplitude | Min |
| Rise time | Max |
| Fall time | Max |
| Telecom serial pattern | RMS |
| Telecom packet recognition | Overshoot + − |
| Wave Shape (matched filter) | Histogram, stdev, mean, pk-pk |
| Runt | Eye Diagrams and mask triggers |
| Waveform Comparisons | Limits masks |
| Peak-to-peak | Frequency |
| Period | |

One skilled in the art will appreciate that this list does not include all possible trigger events, and the scope of the following claims is intended to be broad enough to include those trigger events not specifically recited.

The term DUAL MODE has been used in describing the mode of operation of the subject invention. Use of this term is not critical to the practicing of the subject invention, nor is this term is to be considered limiting in any way.

What has been described is a novel acquisition system for a long record length DSO that solves the "bottleneck" problem by only transferring the data of interest to the main processing section of the oscilloscope. Also, the subject acquisition system maintains the data of the entire long record in memory, thus preserving the timestamps of the data to allow post processing jitter analysis to be performed.

Throughout the specification the terms "event" and "anomaly" have been used interchangeably to indicate a point of interest in the long data record.

While four Processing units 561, 562, 563, 564 have been shown, and described above, other arrangements employing only a single processing unit may be used, and are considered to be within the scope of the invention and covered by the following claims. The use of Processing unit in each channel permits simultaneous triggering on different criteria in each channel, thus permitting simultaneous display of waveforms relating to each trigger.

One skilled in the art will recognize that a given processing unit may be programmed to recognize more than one kind of anomalous event.

While the four Processing units 561, 562, 563, 564 have been described as preferably being FPGAs, one skilled in the art will understand that use of a microcomputer in this role will also work in an acceptable manner, but the speed advantage of the FPGA will not be realized. Therefore the use of a microcomputer, ASIC, or other processor unit is considered to be within the scope of the invention and covered by the following claims.

What is claimed is:

1. An acquisition system for a multi-channel long record length digital oscilloscope, comprising:

a plurality of input terminals for receiving signals under test;

an analog-to-digital converter having an input coupled to said input terminals for receiving said signals under test, and producing digital samples of said signals under test at an output;

a trigger circuit having an input coupled to said input terminals for receiving said signals under test, and producing a trigger signal at an output in response to detection of a predetermined trigger event in one of said signals under test;

deep acquisition memory for storing said digital samples of said signals under test as a plurality of relatively long length data records that form a long length data record as a function of the trigger signal; and processor circuitry for examining said stored digital samples from the long length data record in a post acquisition mode of operation and producing an event detect signal in response to detection of a predetermined secondary event in said stored digital samples, and causing a predetermined amount of said stored digital samples to be read from said acquisition memory for processing and display;

said predetermined amount of said stored digital samples being less than any one of the relatively long length data records and being related in time to said event detect signal.

2. The acquisition system of claim 1 wherein:

said processor operates in one of a one-shot mode and an Autorun mode;

in said one-shot mode said processor circuitry repeatedly examines said long length data record; and in said Autorun mode upon completion of examination of said long length data record said processor circuitry causes the acquisition of new digital samples from said signals under test as the long length data record.

3. The acquisition system of claim 2 wherein:

data representative of said predetermined secondary event is input to said processor circuitry by a user for causing said processor circuitry to produce said event detect signal upon detection of said predetermined secondary event.

4. The acquisition system of claim 3 wherein:

said processor circuitry is responsive to input data entered by a user for changing said data representative of said predetermined secondary event;

said input data entered by said user is accepted by said processor circuitry before or during said examination of said long length data record.

5. The acquisition system of claim 4 wherein:
said predetermined amount of stored digital samples represents a frame of samples surrounding said predetermined secondary event, and a magnitude of said frame is controllable by said user.

6. The acquisition system of claim 5 wherein said oscilloscope has multiple channels:
each of said channels having an acquisition memory associated therewith;
each of said acquisition memories being concatenated with the others to form said deep acquisition memory.

7. The acquisition system of claim 6 wherein
said processor circuitry comprises individual processing units each of which is associated with a respective one of said acquisition memories of said channels.

8. The acquisition system of claim 7 wherein:
each of said individual processing units can be programmed to detect a plurality of different predetermined secondary events; and
waveforms representative of data surrounding each of said different predetermined secondary events are simultaneously displayed on a display screen of said oscilloscope.

9. The acquisition system of claim 6 wherein said processor circuitry is an FPGA.

10. The acquisition system of claim 6 wherein said processor circuitry Is a microcomputer.

11. The acquisition system of claim 6 wherein said processor circuitry is an ASIC.

12. The acquisition system of claim 7 wherein said individual processing units are FPGAs.

13. The acquisition system of claim 7 wherein said individual processing units are microcomputers.

14. The acquisition system of claim 7 wherein said individual processing units are ASICs.

15. A long record length digital oscilloscope, comprising:
a plurality of input terminals for receiving signals under test;
an analog-to-digital converter having an input coupled to said input terminals for receiving said signals under test, and producing digital samples of said signals under test at an output;
a trigger circuit having an input coupled to said input terminals for receiving said signals under test, and producing a trigger signal at an output in response to detection of a predetermined trigger event in one of said signals under test;
a deep acquisition memory for storing said digital samples of said signals under test as a plurality of relatively long length data records that form a long length data record;
a demultiplexer unit coupled between said analog-to-digital converter and said deep acquisition memory for receiving said digital samples and controlling the flow of said samples to said deep acquisition memory in response to said trigger signal;
processor circuitry for examining said stored digital samples from said long length data record in a post acquisition mode of operation and producing an event detect signal in response to detection of a predetermined secondary event in said long length data record; and
a system processor for causing a predetermined amount of said stored digital samples to be read from said deep acquisition memory for processing and display in response to said event detect signal;
said predetermined amount of said stored digital samples being less than one of the relatively long length data records and being related in time to said event detect signal.

16. The long record length digital oscilloscope of claim 15 wherein:
said system processor operates in one of a one-shot mode and an Autorun mode;
in said one-shot mode said system processor repeatedly examines said long length data record;
in said Autorun mode, upon completion of examination of said long length data record, said system processor causes the acquisition of new digital samples from said signals under test as said relatively long length data records.

17. The long record length digital oscilloscope of claim 16 wherein:
data representative of said predetermined secondary event is input to said system processor by a user for causing said system processor to produce said event detect signal upon detection of said predetermined secondary event.

18. The long record length digital oscilloscope of claim 17 wherein:
said system processor is responsive to input by a user for changing said data representative of said predetermined secondary event; said input by said user is accepted by said system processor before or during said examination of said long length data record.

19. The long record length digital oscilloscope of claim 18 wherein:
said predetermined amount of stored digital samples represents a frame of samples surrounding said predetermined secondary event, and a magnitude of said frame is controllable by said user.

20. The long record length digital oscilloscope of claim 19 wherein:
said system processor can be programmed to detect a plurality of different predetermined secondary events; and
waveforms representative of data surrounding each of said different predetermined secondary events are simultaneously displayed on a display screen of said oscilloscope.

21. The long record length digital oscilloscope of claim 20 wherein said system processor is an FPGA.

22. The long record length digital oscilloscope of claim 20 wherein said system processor is a microcomputer.

23. The long record length digital oscilloscope of claim 20 wherein said system processor is an ASIC.

24. A digital storage oscilloscope, comprising:
a plurality of input terminals for receiving signals under test;
an analog-to-digital converter having an input coupled to said input terminals for receiving said signals under test, and producing digital samples of said signals under test at an output;
a trigger circuit having an input coupled to said input terminals for receiving said signals under test, and producing a trigger signal at an output in response to detection of a predetermined trigger event in one of said signals under test;
a deep acquisition memory for storing said digital samples of said signals under test as a plurality of relatively long data records that form a long length data record;

a demultiplexer unit coupled between said analog-to-digital converter and said deep acquisition memory for receiving said digital samples and controlling the flow of said samples to said deep acquisition memory in response to said trigger signal; and a system processor for examining said stored digital samples from said long length data record in a post acquisition mode of operation for detecting a predetermined secondary event in said stored digital samples;

said system processor causing a predetermined amount of said stored digital samples to be read from said deep acquisition memory for processing and display in response to said detection of said predetermined secondary event;

said predetermined amount of said stored digital samples being less than one of said relatively long length data records and being related in time to said event detect signal.

25. The digital storage oscilloscope of claim 24 wherein said oscilloscope has multiple channels:

each of said channels having an acquisition memory associated therewith;

said system processor being capable of being programmed to detect a plurality of predetermined secondary events in said acquisition memories; and waveforms representative of data surrounding each of said predetermined secondary events are simultaneously displayed on a display screen of said oscilloscope.

26. The long record length digital oscilloscope of claim 25 wherein said system processor is an FPGA.

27. The long record length digital oscilloscope of claim 25 wherein said system processor is a microcomputer.

28. The long record length digital oscilloscope of claim 25 wherein said system processor is an ASIC.

29. A method for use in an oscilloscope for displaying a waveform of interest comprising the steps of:

acquiring data from a plurality of signals under test to form a plurality of relatively long length data records that form a long length data record in a deep acquisition memory in response to a trigger signal;

examining the long length data record in a post processing mode of operation for the occurrence of a user-defined secondary event;

upon detection of said user-defined secondary event, applying data comprising an acquisition frame surrounding the said user-defined secondary event to a waveform processing and display system.

30. The method of claim 29 wherein:

said relatively long length data records are replayed to perform said examining and said applying steps throughout the relatively long length data records using different predetermined search criteria defining different user-defined secondary events; and wherein said applying step causes multiple ones of said waveforms of interest to be displayed simultaneously, each being captured as a result of a different one of said user-defined secondary events.

31. The method of claim 29 wherein said relatively long length data records are replayed to perform said examining and said applying steps throughout said relative long length data records using a single search criterion for said user-defined secondary event; and wherein said applying step causes multiple ones of said waveforms of interest to be displayed simultaneously, each being captured as a result of said user-defined secondary event.

* * * * *